(12) United States Patent
Jie et al.

(10) Patent No.: US 9,972,760 B2
(45) Date of Patent: May 15, 2018

(54) FORMATION OF P-TYPE FILLED SKUTTERUDITE BY BALL-MILLING AND THERMO-MECHANICAL PROCESSING

(71) Applicant: University of Houston System, Houston, TX (US)

(72) Inventors: Qing Jie, Houston, TX (US); Zhifeng Ren, Houston, TX (US); Gang Chen, Cambridge, MA (US)

(73) Assignees: UNIVERSITY OF HOUSTON SYSTEM, Houston, TX (US); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 684 days.

(21) Appl. No.: 14/309,567

(22) Filed: Jun. 19, 2014

(65) Prior Publication Data
US 2014/0377120 A1 Dec. 25, 2014

Related U.S. Application Data

(60) Provisional application No. 61/837,070, filed on Jun. 19, 2013.

(51) Int. Cl.
| | | |
|---|---|---|
| *H01L 35/18* | (2006.01) | |
| *C22C 12/00* | (2006.01) | |
| *H01L 35/20* | (2006.01) | |
| *H01L 35/34* | (2006.01) | |
| *C22C 1/04* | (2006.01) | |
| *C22C 1/10* | (2006.01) | |
| *B22F 3/14* | (2006.01) | |

(52) U.S. Cl.
CPC ............ *H01L 35/18* (2013.01); *C22C 1/0491* (2013.01); *C22C 1/1084* (2013.01); *C22C 12/00* (2013.01); *H01L 35/20* (2013.01); *H01L 35/34* (2013.01); *B22F 3/14* (2013.01); *B22F 2301/00* (2013.01)

(58) Field of Classification Search
CPC ............ B22F 3/14; C22C 12/00; H01L 35/18
See application file for complete search history.

(56) References Cited

U.S. PATENT DOCUMENTS

| 6,207,886 B1* | 3/2001 | Kusakabe | ............... H01L 35/18 136/201 |
|---|---|---|---|
| 2006/0118158 A1 | 6/2006 | Zhang et al. | |
| 2011/0101590 A1 | 5/2011 | Mankame et al. | |
| 2012/0000500 A1 | 1/2012 | Iida et al. | |

FOREIGN PATENT DOCUMENTS

EP 1972604 A1 9/2008

OTHER PUBLICATIONS

Yang, J., et al., "Solubility Study of Yb in n-Type Skutterudites YbxCo4Sb12 and their Enhanced Thermoelectric Properties," The American Physical Society, Physical Review B 80, 115329 (2009) (5 p.).
PCT/US2014/043247 International Search Report and Written Opinion dated Oct. 17, 2014 (15 p.).
Jie, Qing, et al., "Fast Phase Formation of Double-Filled p-Type Skutterudites by Ball-Milling and Hot Pressing," Physical Chemistry Chemical Physics, vol. 15, 2013, pp. 6809-6816 (9 p.).

* cited by examiner

*Primary Examiner* — Christopher Kessler
(74) *Attorney, Agent, or Firm* — Conley Rose, P.C.

(57) ABSTRACT

A method of manufacturing a thermoelectric material comprising: ball-milling a compound comprising a plurality of components, the first component M comprising at least one of a rare earth metal, an actinide, an alkaline-earth metal, and an alkali metal, the second component T comprising a metal of subgroup VIII, and the third component X comprises a pnictogen atom. The compound may be ball-milled for up to 5 hours, and then thermo-mechanically processed by, for example, hot pressing the compound for less than two hours. Subsequent to the thermo-mechanical processing, the compound comprises a single filled skutterudite phase with a dimensionless figure of merit (ZT) above 1.0 and the compound has a composition following a formula of $MT_4X_{12}$.

18 Claims, 14 Drawing Sheets

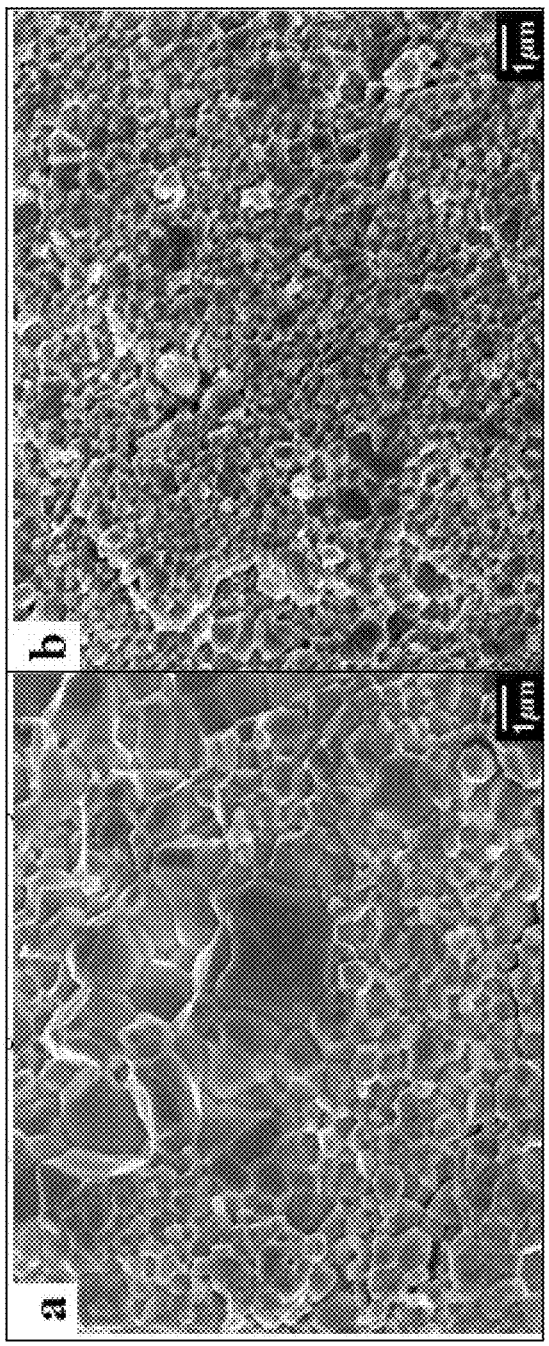

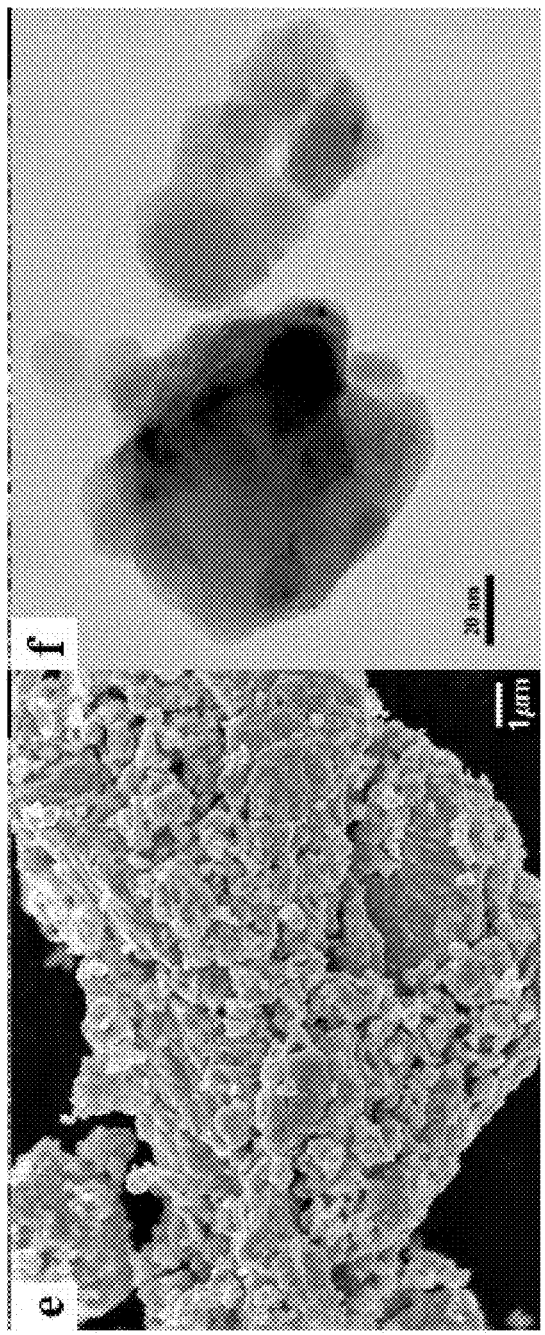

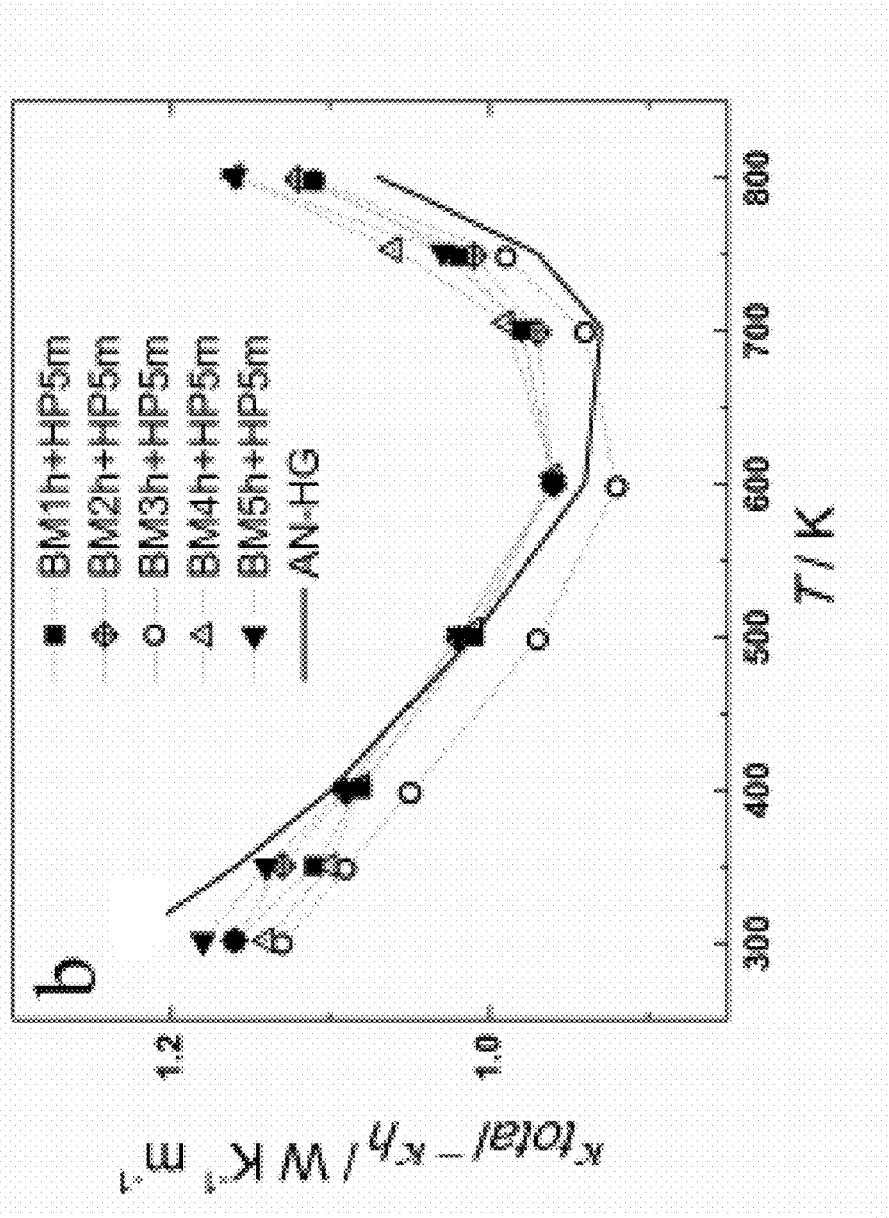

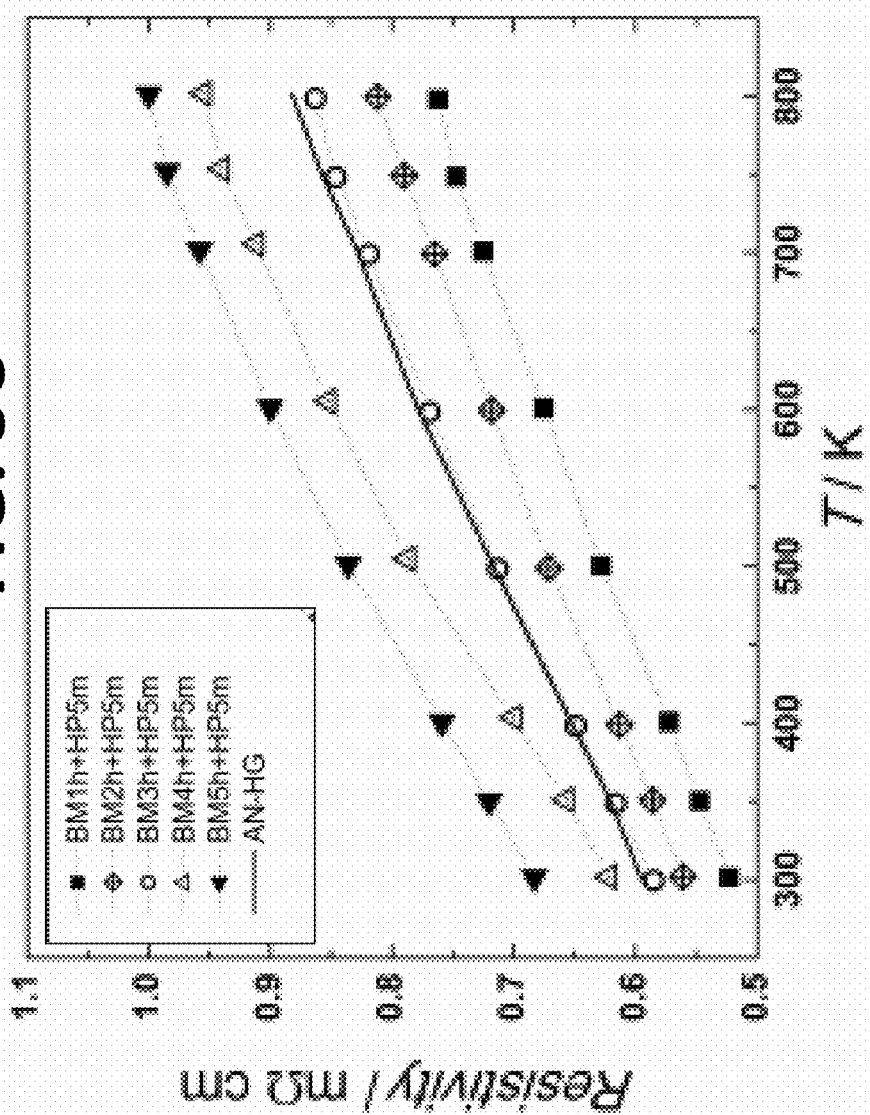

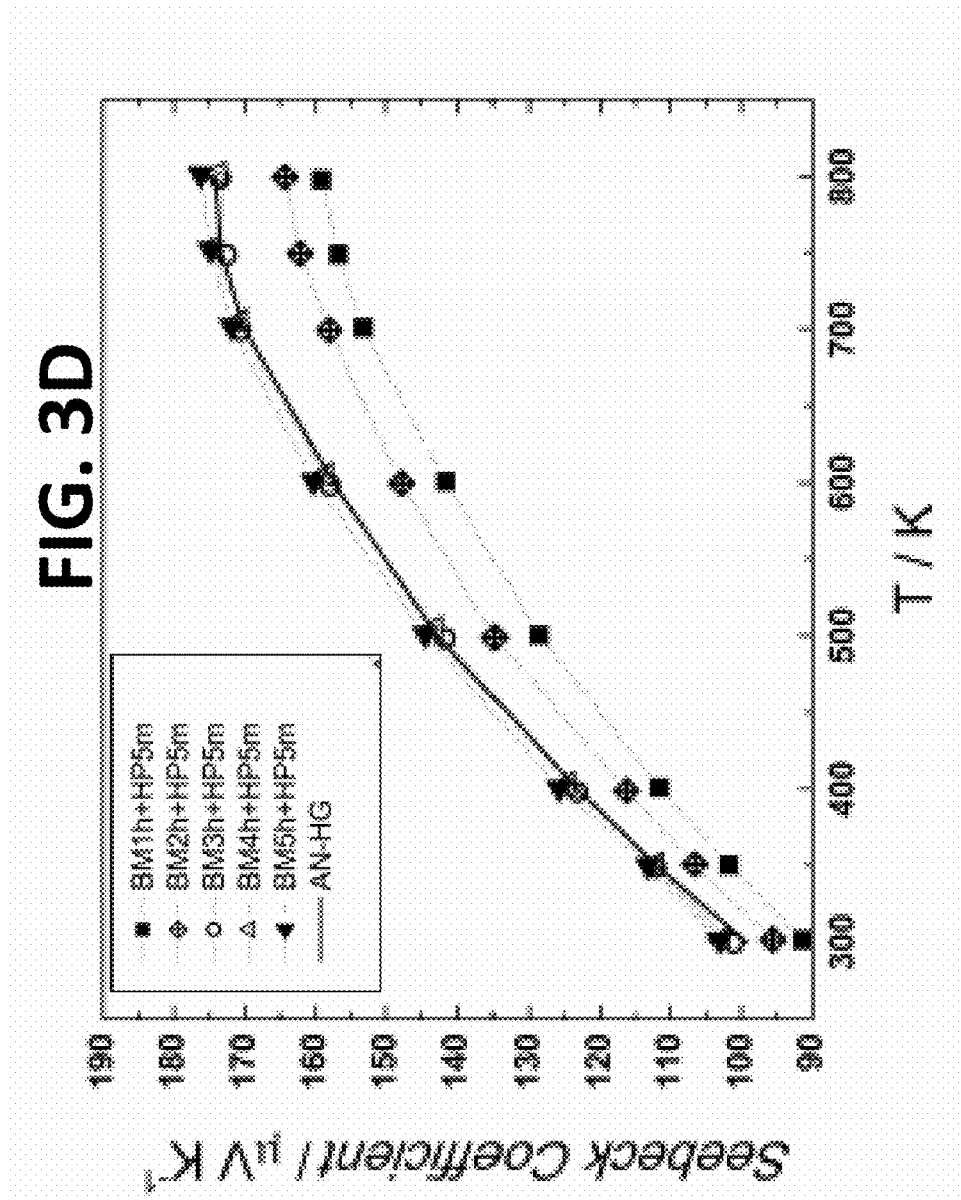

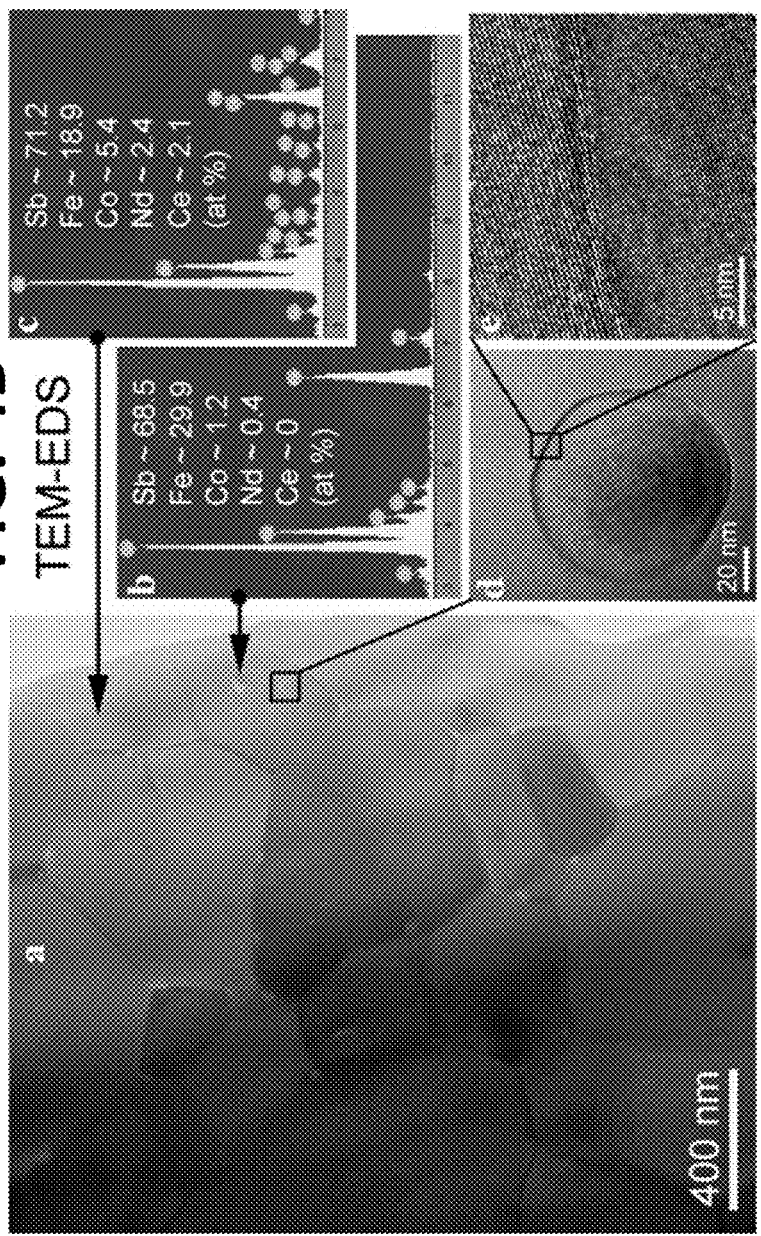

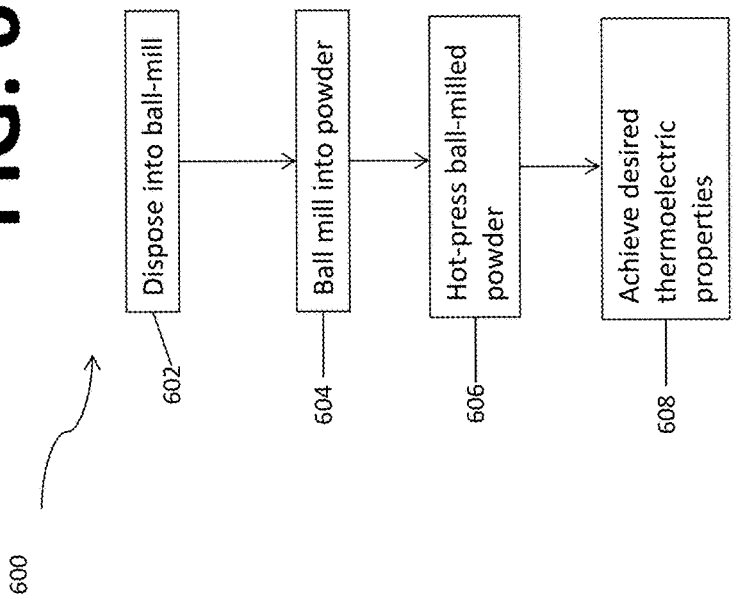

FORMATION OF P-TYPE FILLED SKUTTERUDITE BY BALL-MILLING AND THERMO-MECHANICAL PROCESSING

CROSS-REFERENCE TO RELATED APPLICATIONS

This application claims priority to and incorporates by reference in its entirety U.S. Prov. Pat. App. No. 61/837,070, "Fast Phase Formation of P-Type Filled Skutterudite by Ball-Milling and Thermo-Mechanical Processing," filed Jun. 19, 2013.

STATEMENT REGARDING FEDERALLY SPONSORED RESEARCH OR DEVELOPMENT

Not applicable.

BACKGROUND

Field of the Disclosure

The disclosure relates generally to the manufacture of thermoelectric composites. More particularly, the disclosure relates to the manufacture of thermoelectric composites useful in power generation, electronics, and semiconductors technologies.

Background of the Technology

Materials exhibiting thermoelectric behavior may also be referred to as those exhibiting a thermoelectric effect where a temperature difference creates an electric potential (converting temperature to current), or when an electric potential creates a temperature difference. Materials exhibiting thermoelectric behavior within specific temperature ranges may be desirable for applications such as power generation, power efficiency in electronics, and semiconductors.

BRIEF SUMMARY OF THE DISCLOSURE

In an embodiment, a method of manufacturing a thermoelectric material comprising: thermo-mechanically processing a ball-milled compound for less than two hours, wherein the ball-milled compound is formed by vacuum-melting and comprises a first component M, a second component T, and a third component X, wherein, subsequent to the thermo-mechanical processing, the compound having the a formula of $MT_4X_{12}$, and wherein the compound comprises an average grain size from about 200 nm to about 500 nm, a dimensionless figure of merit (ZT) above 1.0.

In an alternate embodiment, a method of manufacturing a thermoelectric material comprising: thermo-mechanically processing a ball-milled compound, wherein the compound comprises a first component M, a second component T, and a third component X, wherein, subsequent to the thermo-mechanical processing, the compound comprises a dimensionless figure of merit (ZT) above 1.0, and is a composition having the formula of $MT_4X_{12}$.

In an embodiment, a thermoelectric compound comprising: a figure of merit (ZT) above 1.0, the thermoelectric compound having a formula of $MT_4X_{12}$.

Embodiments described herein comprise a combination of features and characteristics intended to address various shortcomings associated with certain prior devices, compositions, systems, and methods. The various features and characteristics described above, as well as others, will be readily apparent to those of ordinary skill in the art upon reading the following detailed description, and by referring to the accompanying drawings. It should be understood that the conception and the specific exemplary embodiments disclosed may be readily utilized as a basis for modifying or designing other compositions, structures, systems and/or methods for carrying out the same purposes of the embodiments disclosed herein. It should also be understood that such equivalent constructions do not depart from the spirit and scope of the invention as set forth in the appended claims.

BRIEF DESCRIPTION OF THE DRAWINGS

For a detailed description of the exemplary embodiments disclosed herein, reference will now be made to the accompanying drawings in which:

FIGS. 2A-2F illustrate grain sizes of a plurality of hot-pressed materials with different ball-milling times according to certain embodiments of the present disclosure.

FIG. 3A-3F illustrate the temperature dependency of thermoelectric properties according to certain embodiments of the present disclosure.

FIGS. 4A-4E illustrate a bright-field TEM image of crystal grain size and the chemical composition and particle and inclusion sizes of that image according to certain embodiments of the present disclosure.

FIG. 6 illustrates a method of manufacturing the thermoelectric materials according to embodiments of the present disclosure according to certain embodiments of the present disclosure.

DETAILED DESCRIPTION OF THE DISCLOSED EMBODIMENTS

Figure 1A:
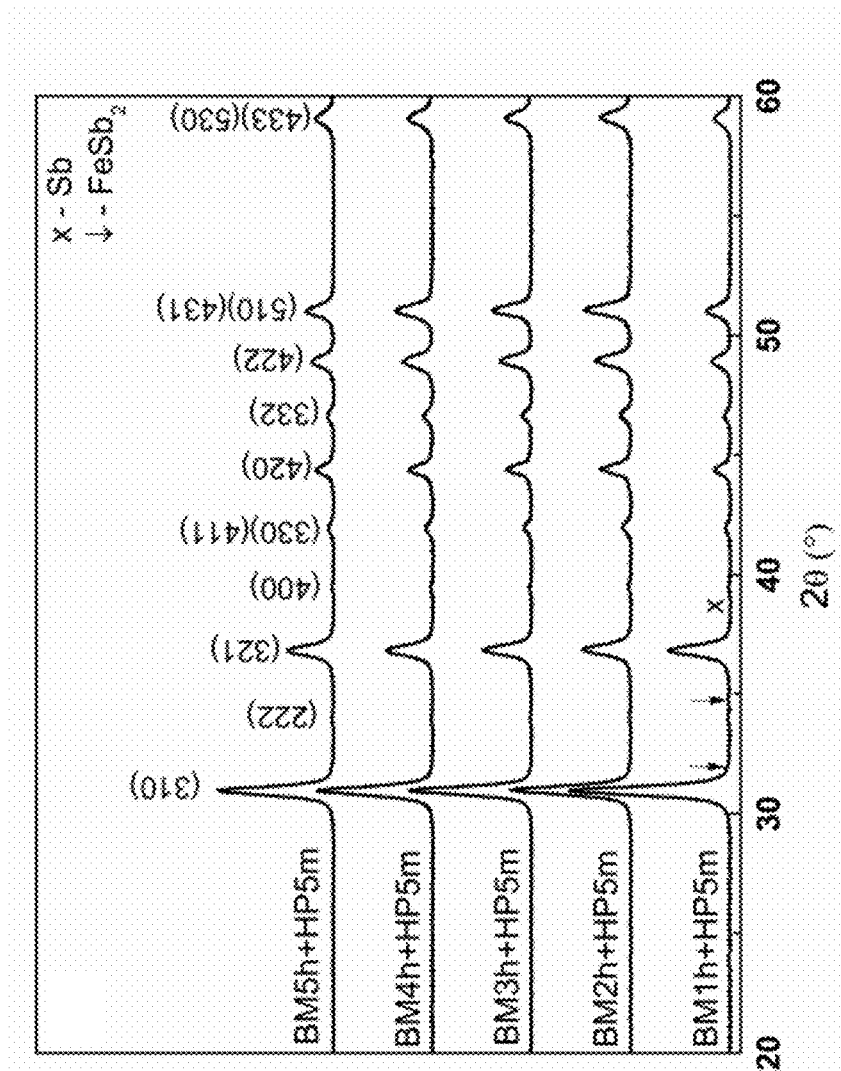
FIG. 1A illustrates a comparison of a plurality of x-ray diffraction patterns from a plurality of hot-pressed samples prepared with varying ball-milling times according to certain embodiments of the present disclosure.

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection.

The disclosure herein incorporates in its entirety J. Yang, Q. Hao, H. Wang, Y. C. Lan, Q. Y. He, A. Minnich, D. Z. Wang, J. A. Harriman, V. M. Varki, M. S. Dresselhaus, G. Chen and Z. F. Ren, *Solubility Study of Yb in N-Type Skutterudites YbxCo4Sb12 and Their Enhanced Thermoelectric Properties*, Phys. Rev. B: 80 Condens. Matter Mater. Phys., 115329-1-115329-5 (2009) (hereinafter "Yang").

In some cases, skutterudite, a mineral typically comprising arsenic (As) as well as cobalt (Ni), iron (Fe), and antimony (Sb), may be used for its thermoelectric properties. The mineral lattice of skutterudite may be described in its naturally occurring state as "unfilled" because there are voids in the lattice. These voids may be filled by, for example, rare earth elements that comprise low-coordination ions. Filling the skutterudite with a component such as the rare earth elements may alter the thermal conductivity of the material by producing sources for lattice phonon scattering. In addition, filling the skutterudite may decrease thermal conductivity without reducing electrical conductivity, which may be desirable because the thermal conductivity and electrical conductivity may be said to be in competition with respect to device efficiency. With respect to at least devices and semiconductors, the electric conductivity may be desired and the thermal conductivity may not be desired, so it is preferable to work with materials for these and similar applications that have a low thermal conductivity and a high electric conductivity. Thus, in order to optimize the dimensionless figure of merit (ZT), the material may preferably exhibit phonon-glass, electron-crystal behavior (PGEC). PGEC behavior may be the term used to describe when the phonons in a material behave as they would in a glass while the electrons in the material behave as they would in a crystal. That is, the phonons experience a high degree of scattering which lowers thermal conductivity and the electrons therefore experience a very low degree of scattering and maintain the electrical conductivity. The increasing demand for technologies that utilize these filled-skutterudite materials may mean that the traditional preparation method discussed below that may take 7-14 days may not be desired by industry and instead a more efficient, faster, cost-effective way that may have a lower environmental impact may instead be preferred.

In some cases, for example in the semiconductor industry, the device efficiency is proportional to ZT and preferred materials may have a large Z value at higher temperatures (where Z is the figure of merit and ZT is the dimensionless figure of merit). The ZT may be optimized by maximizing electrical conductivity at high temperatures and minimizing the thermal conductivity, as it is appreciated that temperature may be more easily adjusted than electrical conductivity. As such, improvements in thermoelectric materials may involve reducing lattice thermal conductivity in at least alloys, complex crystals, and nano-composites.

In an embodiment, a plurality of filled-skutterudites were synthesized according to embodiments of the present disclosure to comprise a chemical formula $MT_4X_{12}$, where M is a rare earth or actinide, alkaline-earth, alkali metal, T is a transition metal of subgroup VIII, and X is pnictogen atom. The plurality of filled-skutterudites are compounds with body-centered cubic crystal structure (space group $Im\bar{3}^1$) in which M atoms residing in the large icosahedral voids surrounded by the tilted $[TX_6]$ octahedrons.

The energy conversion efficiency of a thermoelectric (TE) material is related to the dimensionless thermoelectric figure of merit ZT, expressed as $ZT=[S2/(\rho\kappa)]T$, where, and where S is the Seebeck coefficient, $\rho$ is the electrical resistivity, $\kappa$ is the thermal conductivity, and T is the absolute temperature. The traditional preparation of filled-skutterudite includes three steps: (1) fully reaction of different elements by melting at a temperature above 1000° C., (2) quenching and (3) annealing for an extended time. The annealing process for p-type filled-skutterudite may be utilized because the binary skutterudite $Fe_4Sb_{12}$ may not form a stable phase due to the charge imbalance. Therefore, the binary skutterudite $Fe_4Sb_{12}$ may utilize filler atoms to enter the cage and provide the missing electrons. For p-type, as quenched ingot contains $FeSb_2$, Sb and small amounts of other phases. Homogenization at a temperature of about 600° C. to about 900° C., preferably from about 650° C. to about 700° C., after quenching may be utilized to form the homogeneous filled-skutterudite phase. In an alternate embodiment, the homogenization may occur in ranges of varying size that may be within the range of about 600° C. to about 900° C. Different phases react together to form a pure filled skutterudite phase during this annealing process, which may last from 3 days to 14 days, and may preferably last from about 6 days to about 8 days. In alternate embodiments, the synthesis of other compositions may employ the use of high pressure or other means of non-equilibrium synthesis. Preferably, a fast preparation method which employs a shorter annealing time (less than 14 days) may be employed.

However, using conventional methods, no ZT above 1 has been reported for fast synthesized p-type filled-skutterudites. Unlike the n-type filled skutterudite, a quenched p-type ingot may be mainly composed of $FeSb_2$, Sb phases with relatively large grains, instead of a skutterudite phase. In some cases, the thermoelectric material fabrication may employ an annealing time of a minimum of 7 days to form the skutterudite phase formation. This annealing time is because the atoms travel a long distance by diffusion to enable the reaction between $FeSb_2$, Sb and filler atoms. Ball-milling, as illustrated herein, even in the absence of post-casting processing such as annealing or other homogenization, is a suitable method for preparing high performance thermoelectric nano-composite materials when it is utilized to reduce a plurality of materials into nano-sized grains.

As discussed herein, a fast preparation method for Cerium and Neodymium double-filled p-type skutterudite $Ce_{0.45}Nd_{0.45}Fe_{3.5}Co_{0.5}Sb_{12}$ is described herein. The fast preparation method disclosed herein is referred to as "fast" since the method uses direct ball-milling of the as-cast ingot without prior annealing, which conventionally may occur for a period of hours, days, or greater lengths of time. As used herein, the term "as-cast" indicates a material that is cast into ingot or other form and then solidified (such as by quenching or otherwise) but not further processed, for example by annealing, after solidification. In certain embodiments, an "as-cast" material may be broken down into smaller pieces prior to ball-milling.

Multiple filling of vacancies extends the range of resonant frequencies, and hence enhances the dimensionless figure of merit (ZT) of skutterudite by reducing lattice thermal conductivity. By choosing the compositions as indicated herein, high ZT values were achieved for fast synthesized p-type skutterudite. Ball-milling greatly accelerated the phase formation by breaking the ingot into nano-sized particles and mixing different phases into a homogenous composition. The details on the effect of ball-milling on grain size and physical properties for the samples prepared by this method are discussed herein.

As discussed in detail below, in one embodiment, a high quality double-filled p-type skutterudite $Ce_{0.45}Nd_{0.45}Fe_{3.5}Co_{0.5}Sb_{12}$ has been prepared by directly ball-milling the quenched ingot without annealing, where the ball milling was followed by hot-pressing at 650° C. (923.15K) for about 5 minutes. The pure skutterudite phase has been achieved using the systems and methods discussed herein including a ball-milling for a time longer than about 2 hours. Without limitation to any particular theory, it is presently believed that the ball milling greatly accelerated the skutterudite phase formation during hot-pressing by breaking the ingot into nano-sized grains and hence reduced the distance the filler atoms need to travel. In some embodiments, depending upon factors including composition and ball-milling settings, the nano-sized grains form aggregations during ball-milling. The size of these aggregations vary from about 0.1 μm to about 1 μm and are related to the size of the grains in the final hot-pressed pellet. All three samples synthesized using ball-milling time at least 3 hours showed desirable power factors and peak ZT values higher than 1 above 750 K, which is comparable to the highest ZT value reported for p-type filled-skutterudite. This method can save the processing time by reducing the phase formation time from about 7-14 days to a substantially shorter time, for example, a matter of hours or days, which is desirable for large scale industrial production. The systems and methods disclosed herein may also serve as an alternative preparation method for some materials which are kinetically difficult to synthesize or requires a non-equilibrium synthesis method.

Experimental Procedure:

In an embodiment, the experimental procedure discussed herein used the following materials for ingot preparation: a cerium (Ce) ingot (99.8%, Alfa Aesar), a neodymium (Nd) ingot (99.6%, Alfa Aesar), iron (Fe) pieces (99.99%, Alfa Aesar), cobalt (Co) slugs and foil (99 0.95%, Alfa Aesar), and antimony (Sb) chunks (99.999%, Chengdu Chemphys Chemical Industry, China) were weighted according to the stoichiometric formula $Ce_{0.45}Nd_{0.45}Fe_3.5Co_{0.5}Sb_{12}$ and loaded into carbon coated quartz tubes in a glove box with the protection of Argon gas protection. In other embodiments, different combinations of chunks, foils, wires, slugs, and other forms of elements of the correct purity may be used. As used herein, the term "ingot" may refer to a cast material of varying shape and size, and be used to refer to the raw materials as noted above as well as to the compound formed by the vacuum melting or other melting of the raw materials (components) to form the compound. Turning back to this embodiment, the tubes were sealed in vacuum ($3 \times 10^{-6}$ mbar) and were slowly heated to 1080° C. (~1353.15K) in a box furnace and stayed at this temperature for 24 hours before they were quenched into water. The quenched ingots were then taken out from the quartz tube and cleaned using a wire brush and pure ethanol alcohol. In an embodiment, these quenched ingots are as-cast ingots, i.e., the as-cast ingots are not annealed or otherwise further treated/homogenized prior to ball-milling. In an alternate embodiment, the as-cast ingots may be processed to break the ingots into smaller pieces prior to ball-milling.

Ball-Milling and Hot-Pressing:

A SPEX high energy ball-milling machine (8000M) and a 65 ml hardened steel grinding vial with two φ½" (12.7 mm) and four φ¼" (6.35 mm) hardened 440C stainless steel balls were used for ball-milling. To prevent oxidization, the ball-milling vial was properly sealed inside a "glove box." About 2 grams of the ball-milled powder was taken out for hot-pressing after about every one hour ball-milling. The ball milled powders were loaded into a graphite die with an inner diameter of 12.7 mm, an outer diameter of 51 mm, and a height of 38 mm, and pressed by direct current induced hot-pressing (DC-HP) to produce the final discs for the measurements. It is understood that, in alternate embodiments, other hot-press molds of varying dimensions may be utilized. In this example, the pressure used for hot-pressing was 76 MPa. The powder was heated to 650° C. (923.15K) in 3 minutes, and then kept at this temperature for 5 minutes before the heating power was shut off so that the samples could cool. The samples were labeled as Ball-milling (BM) 1h+hot-pressing (HP)5m, BM2h+HP5m, BM3h+HP5m, BM4h+HP5m, and BM5h+HP5m for ball-milling time of 1 h, 2 h, 3 h, 4 h, and 5 h, respectively. It is appreciated that these samples may be referred to herein as the 1 h, 2 h, 3 h, 4 h, and 5 h samples. It is appreciated that the ball-milling and hot-pressing parameters may vary depending on the composition of the material. In some embodiments, the powder may be heated between about 500° C. (773.15K) and about 800° C. (1073.15K).

For comparison, another ingot was prepared using a conventional quenching and annealing method. The annealed ingot was then hand ground using and agate mortar and pestle for 30 minutes. A pellet was hot-pressed using the hand ground powder with the same parameters used for ball-milled powder, and labeled as sample "AN-HG."

Sample Characterization:

X-ray diffraction analysis was conducted on the polished surfaces of the hot-pressed pellets by a Bruker axs X-ray Diffractometer. The microstructures were investigated by a Scanning Electron Microscope (SEM, JEOL 6340F) and High Resolution Transmission Electron Microscope (HR-TEM, JEOL 2010F). Bars with approximate dimensions of 2×2×12 mm3 were prepared for Seebeck coefficient S and electrical resistivity ρ measurements as well as Power Factor (S2/ρ) calculation. The electrical resistivity and Seebeck coefficient were simultaneously measured on a commercial system (ULVAC ZEM-3) using the four-point dc current-switching method and the static temperature difference method. Disks of ~2 mm thick were prepared for thermal diffusivity and volume density measurement. The thermal diffusivity (α) was measured on a laser flash apparatus (Netzsch LFA 457) with flowing argon gas protection. The specific heat capacity of the sample was determined on a DSC system (Netzsch DSC 404 C). The volume density (D) was quantified by an Archimedes method, since its measurement error is small enough for the thermal conductivity estimation. The densities (D) and relative densities (DR) of all the samples prepared in this work are listed in Table 1. All these samples are relatively dense varying from 97% to 97.7% of the theoretical density.

FIG. 1A illustrates a comparison of a plurality of x-ray diffraction patterns from a plurality of samples after varying ball-milling times. FIG. 1A compares the X-ray diffraction patterns of all the five pellets prepared with different ball-milling times (1, 2, 3, 4, and 5 hours) The samples labeled as BM1h+HP5m and BM2h+HP5m have detectable minor amount of second phases $FeSb_2$ and Sb. All the other three samples have pure filled skutterudite phase, which suggests that with a ball-milling time longer than 2 hours, a 5 minutes hot-pressing at 650° C. (923.15K) may be sufficient to convert the powder into pure filled-skutterudite phase. This hot-pressing temperature may be about the same as used for the annealing step in conventional preparation of this material in ingot. To get a clear view of the ball-milling effect, the same hot-pressing temperature was used for all samples, however, the hot-pressing temperature may vary depending upon factors including but not limited to: the material composition, particle size, end application.

Figure 1B:
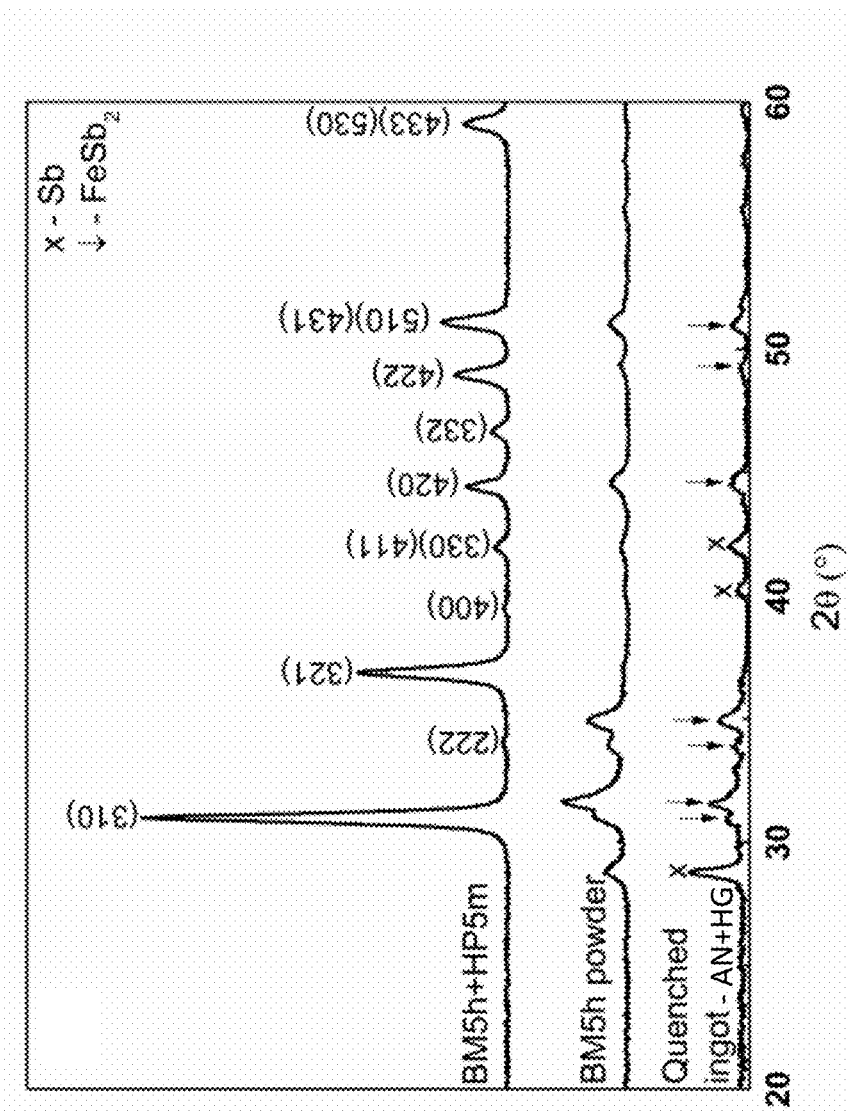
FIG. 1B illustrates x-ray diffraction patterns of the material in various stages of manufacture according to certain embodiments of the present disclosure.

FIG. 1B illustrates x-ray diffraction patterns of the material in various stages of manufacture. In particular, FIG. 1B illustrates the X-ray diffraction (XRD) patterns of the quenched ingot, the powder after 5 hours ball-milling, and the pellet hot-pressed from it for 5 minutes, BM5h+HP5m, are shown in FIG. 1B. Like the quenched ingot, the majority phases of the ball-milled powder are still $FeSb_2$ and Sb, which means that it is not the high energy ball-milling that directly convert the ingot into filled-skutterudite phase even after 5 hours ball-milling. The conversion may occur during hot-pressing which accelerates the filler atoms to enter the cage. Both appropriate ball-milling and hot-pressing temperatures are used to form the filled-skutterudite phase.

Figures 2C, 2D:
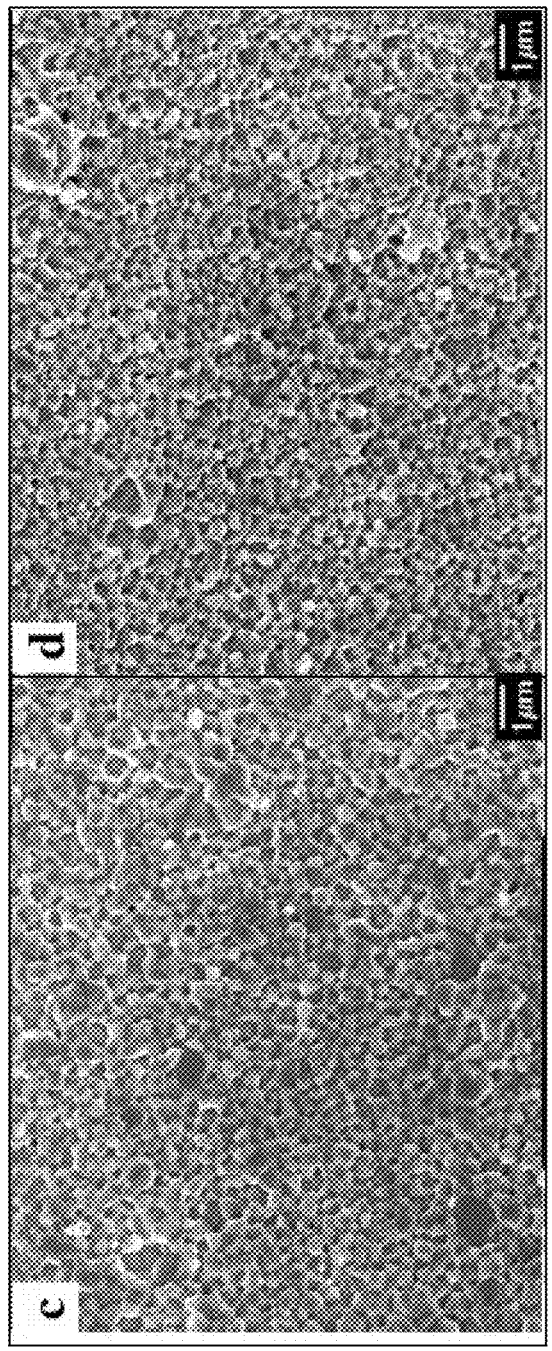

FIGS. 2A-2F illustrate grain sizes of the hot-pressed material with different ball-milling times. The grain sizes of the hot pressed samples prepared with different ball-milling times are compared in FIG. 2. With 1 hour ball-milling, some grains are still as big as 5 µm (FIG. 2A). The average grain size was greatly reduced by longer ball-milling time, e.g., 2 hours (FIG. 2B). However, after that, the ball-milling became very ineffective on breaking down the grain sizes (FIG. 2C at three hours and 2D at five hours). The average grain sizes of BM3h+HP5m in FIG. 2C and BM5h+HP5m in FIG. 2D are almost the same in this example. In other embodiments, the ball-milling time may be from 5 minutes-5 hours depending upon the material composition and/or other factors. In some embodiments, the ball-milling time is less than about 2 hours.

To determine why the sample grain size may not change with a ball-milling time longer than two hours for some alloys, both an SEM and a TEM were used to observe the as-ball-milled powder. The scanning electron microscopy (SEM) image of the filled-skutterudite as ball-milled powder after 5 hours ball-milling is shown in FIG. 2E. Surprisingly, most of the particles are bigger than 1 µm, although some of them are as small as 200 nm. In alternate embodiments, particle sizes may range from 50 nm to larger than 1 µm, and in other embodiments the average particle size may be below 1 µm, as well as subsets of sizes within the stated ranges. These observed grain diameters/particle sizes were different than the small grain size observed on the hot-pressed pellets. To determine the real grain size after ball-milling, the same powder was dispersed into ethanol alcohol for 1 hour using an ultra-sonic cleaner. Then one drop of this mixture was dripped onto a copper grid and dried before used for transmission electron microscopy (TEM) investigation. The (TEM) image of these powder is shown in FIG. 2F. From the particle on the right side of this image, it is observed that the sample contains grains about 20 nm in diameter, these nano-particles may not be isolated but may instead be aggregated into larger particles. Most of the particles observed are as big as the aggregation on the left side of the TEM image in FIG. 2F. It may be hard to tell single grains in this big particle because the grains segregated, that is, this particle contains lots of nano-sized grains which aggregate together. Since this aggregation is thick in the middle, it is very hard for the TEM image to give enough contrast to show each single grain in the middle. Grains about 20 nm in diameter were observed at the boundary of this big aggregation. Both the SEM (FIG. 2E) and TEM images (FIG. 2F) of the ball-milled powder indicate that the energy of ball-milling makes the particles stick together and form aggregations. The grain sizes observed in the hot-pressed pellet (FIG. 2D) are very close to the size of the aggregations, which indicates that, in this embodiment, the aggregation size determines the final grain size in the hot-pressed pellet.

According to above results and discussion, it is evident that ball milling did break the quenched p-type skutterudite ingot into nano-particles with the grain size around 20 nm (FIG. 2F) and mixed different phases homogeneously. With this configuration, the distance the filler atoms need to travel has been greatly reduced. Using this method, the filled-skutterudite phase is formed in just 5 minutes of hot-pressing instead of days annealing. Although one example focused on filled p-type skutterudite in this work, this technique may be generally useful for many other material systems, since diffusion is one of the core topics for material science. This technique could also be useful for thermodynamically difficult systems, such as metastable systems. With nano-sized phases mixed together, diffusion can be finished with lower temperature, at which metastable phases could remain unchanged. As there are different compositions that may be used in this method as discussed below, there may be varying combinations of ball-milling and hot-pressing conditions and resulting particle sizes. In some embodiments, the smallest grain size achievable after hot pressing is from 200 nm-800 nm, and the particle size after ball-milling may be from 20 nm-5 microns. In some embodiments, the particle size after ball-milling may be less than 20 nm.

Figure 3A:
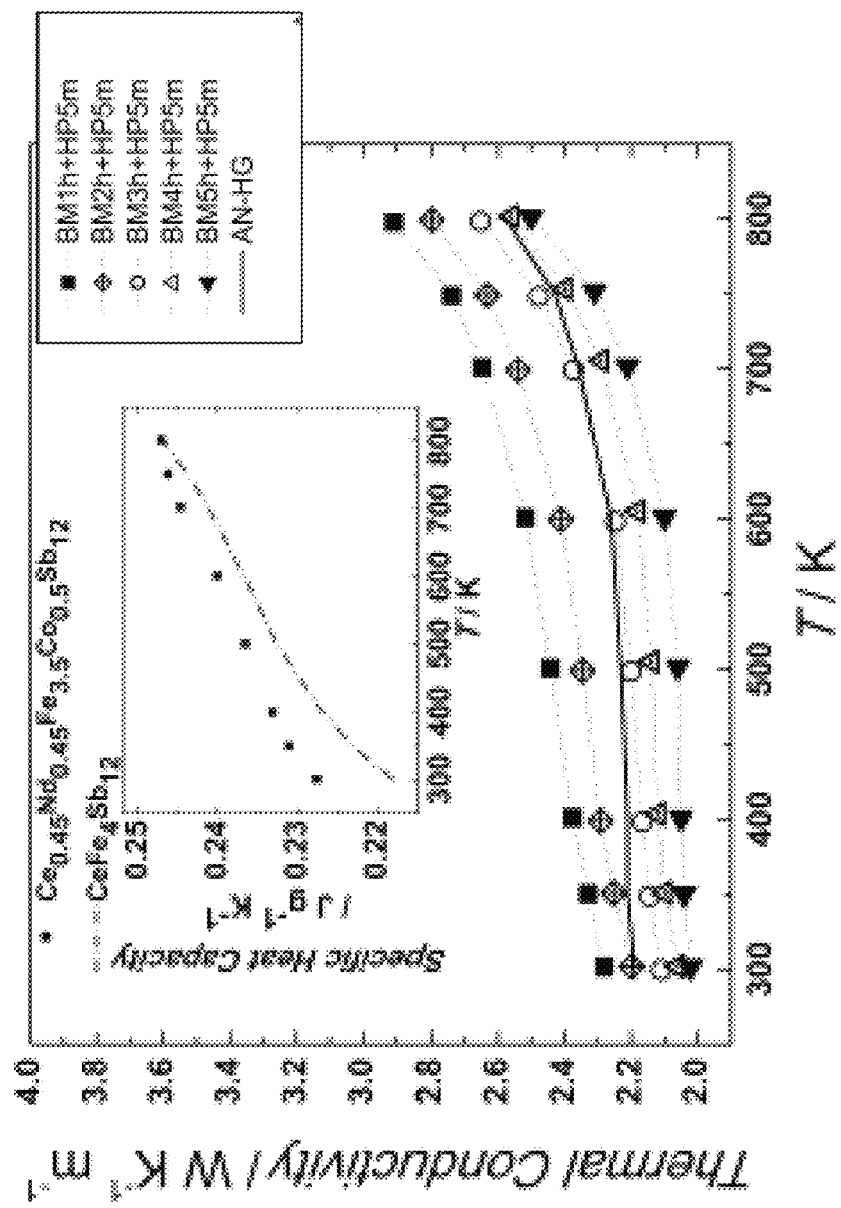

FIG. 3A illustrates the temperature dependency of thermal conductivity. FIG. 3A shows the temperature dependence of thermal conductivity on the samples ball milled for 1 h, 2 h, 3 h, 4 h, and 5 h as well as sample AN-HG. The dotted line shown in the inset graph in FIG. 3A indicates reference data from Yang, and the solid line in the inset indicates specific heat capacity calculations based upon the sample of $Ce_{0.45}Nd_{0.45}Fe_{3.5}Co_{0.5}Sb_{12}$. The thermal conductivities decreases with balling time, and increase with temperature. For example, at about 700K, the thermal conductivity of the sample ball-milled for 1 h is higher than the thermal conductivity for the other samples, and is higher than the thermal conductivity for that (1 h) sample measured below about 700K. All the thermal conductivities follow the similar trend on temperature. The temperature dependence of the specific heat capacity is shown as the inset of FIG. 3A.

To get a clear view of how ball-milling time affects the phonon transport, the primary carrier thermal conductivity ($\kappa_h$) was subtracted from the total thermal conductivity ($\kappa_{total}$), where $\kappa_h$ was obtained using the Wiedemann-Franz law. By using the simple one parabolic band model, and assuming that acoustic phonon scattering is the dominating mechanism for carrier scattering, the temperature-dependent Lorenz number was calculated from the reduced Fermi energies, which were estimated from the Seebeck coefficients. It is assumed that holes are scattered by acoustic phonons for temperatures above 300K (26.85° C.) for the calculation. The band structure calculations suggested that p-type filled skutterudites with similar compositions have very small band gap. For these materials, the intrinsic excitation of electrons at high temperature would result in bipolar thermo-diffusion effect, because of which, all thermal conductivity curves in FIG. 3A upturn above 500 K. For the samples show bipolar effect, the total thermal conductivity can be expressed as $$\kappa_{total} = \kappa_L + \kappa_{carrier} = \kappa_L + \kappa_h + \kappa_e + \frac{\sigma_e \sigma_h}{\sigma_e + \sigma_h}(S_h - S_e)^2 T$$

Where $\kappa_L$ is the lattice thermal conductivity, $\kappa_e$ is the electron thermal conductivity, $\sigma_e$ is the partial electrical conductivity for holes, $\sigma_h$ is the partial electrical connectivity for electrons, $S_h$ is the Seebeck coefficient for holes, and $S_e$ is the Seebeck coefficient for electrons. Below 500K (226.85° C.), when the electron concentration is low, the contribution from the last two parts in the equation may be negligible. As such, the $\kappa_{total}-\kappa_h$ values in FIG. 3A may still reflect the lattice thermal conductivities for the respective samples.

As illustrated in FIG. 3A, the total thermal conductivity decreases with increasing ball-milling times. The majority of the decrease of the total thermal conductivity may come from the increase of electrical resistivity. FIG. 3C illustrates the effect of temperature on the resistivity of the plurality of samples ball-milled for varying times. The resistivity increases in a single sample as the temperature increases and increases among and between the samples as the ball-milling time increases. For example, the resistivity of the 5 h sample is higher at the measured temperatures than the resistivity of the other samples, and higher than the resistivity of the same (5 h) sample at lower temperatures. FIG. 3B illustrates the effect of temperature on the lattice thermal conductivity. The lattice thermal conductivity ($\kappa_{total}-\kappa_h$) of each of the five samples are close considering the measurement error, except for BM3h+HP5m. This sample, BM3h+HP5m, has the lowest lattice thermal conductivity among all the samples prepared with ball-milling and hot pressing in this example, and shows lower lattice thermal conductivity compared with the AN-HG up to 650 K (376.85° C.) as illustrated in FIG. 3B. As evident from FIGS. 1A-1B and FIGS. 2A-2F, as compared with samples prepared with ball-milling longer than 3 hours, BM1h+HP5m and BM2h+HP5m comprise larger average grain sizes and smaller amounts of the impurity phases of $FeSb_2$ and Sb. However, almost no difference can be observed on the $\kappa_{total}-\kappa_h$ of these four samples.

The electrical resistivity of all five samples increase with ball-milling time (FIG. 3C). Among them, the electrical resistivities of BM1h+HP5m and BM2h+HP5m are lower than that of sample AN-HG. Three hours ball-milling produced a sample with almost the same electrical resistivity as that of AN-HG (FIG. 1B), suggesting a relatively pure phase, which is consistent with the results from X-ray diffraction in FIGS. 1A and 1B. As illustrated in at least FIG. 1A, an increasing ball-milling time longer than 3 hours, the samples show even higher electrical resistivity.

Figure 3E:
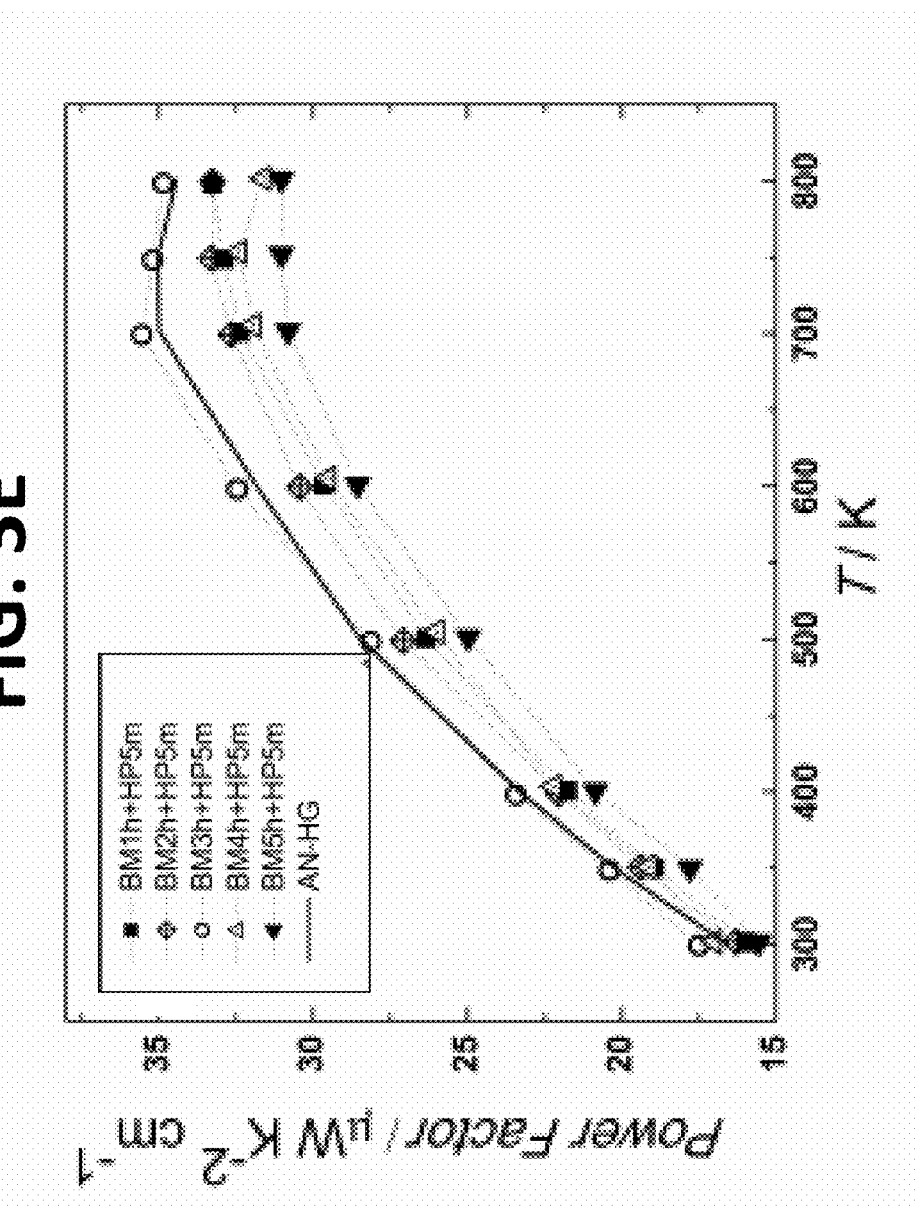
Figure 3F:
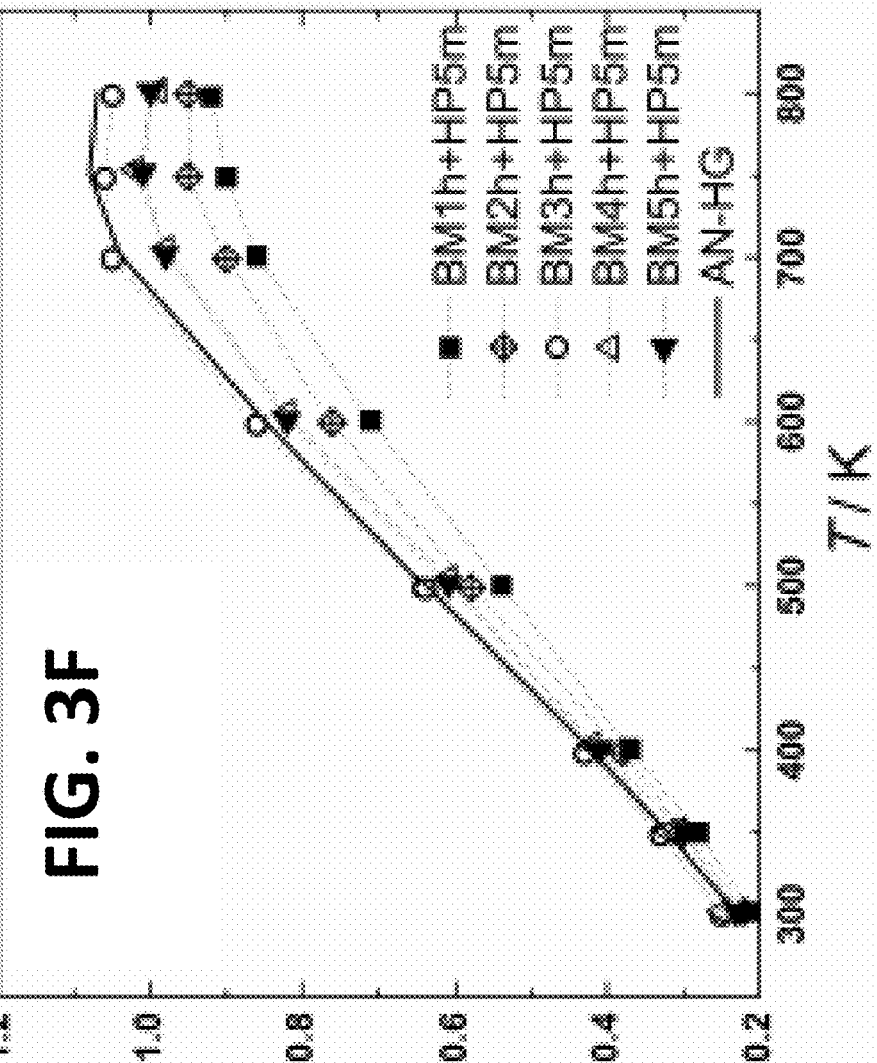

On the other hand, these defects from ball-milling did not affect the lattice thermal conductivity, given $\kappa_{total}-\kappa_h$ of all the samples except BM3h+HP5m are very close. The phase purity is the key to get p-type filled-skutterudite samples with high Seebeck coefficient. The impurity phases in BM1h+HP5m and BM2h+HP5m also lead to lower Seebeck coefficients (FIG. 3D), since both $FeSb_2$ and Sb have small Seebeck coefficient above room temperature. The samples (BM3h+HP5m, BM4h+HP5m, and BM5h+HP5m) prepared with a longer ball-milling time (3 h, 4 h, and 5 h) showed almost the same Seebeck coefficient, and are very close to that of AN-HG (FIG. 3D). Among these samples, the sample BM3h+HP5m has the highest power factor (FIG. 3E). The ZT values of these samples exceeded 1 above 750 K (476.85° C.) (FIG. 3F) The best sample, BM3h+HP5m, has ZT values above 1 between 700 K (426.85° C.) and 800 K (526.85° C.), which is comparable to the peak ZT value of AN-HG and the highest ZT value typically associated with p-type filled-skutterudite.

FIGS. 4A-4E illustrates a bright-field TEM image of crystal grain size and the chemical composition and particle and inclusion sizes of that image. The bright-field TEM image in FIG. 4A shows that the crystal grain size observed in this area is around 200-800 nm. Some small inclusions (scattered white or black spots) around 50 nm in diameter were observed both inside the grains and on the grain boundaries. Two TEM-Energy-Dispersive X-ray Spectroscopy (EDS) spectra in FIGS. 4B and 4C show the chemical composition of the included particle (FIG. 4B) and the skutterudite matrix (FIG. 4C). The matrix spectrum shown in FIG. 4C is consistent with what the nominal composition, although it contains a little more Co compared with the nominal composition. However, the composition of the particles in FIG. 4B shows that the inclusion contains very few filler atoms. The atomic ratio between (Fe+Co) and Sb in the inclusion is very close to 1:2, which may suggest that the inclusions could be $(Fe,Co)Sb_2$ particles that were isolated during the growth of filled-skutterudite grains and lost the opportunity of reacting with other phases to form the filled-skutterudite phase. In one crystal grain in FIG. 4A, one inclusion (in the square) has almost the same chemical composition as the other one (pointed by the shorter arrow) with its TEM-EDS spectrum shown in FIG. 4B. The enlarged TEM image shown in FIG. 4D and the High Resolution TEM (HRTEM) microphotograph shown in FIG. 4E show that the inclusion is a kind of crystal grain embedded into a bigger crystalline matrix.

Figure 5:
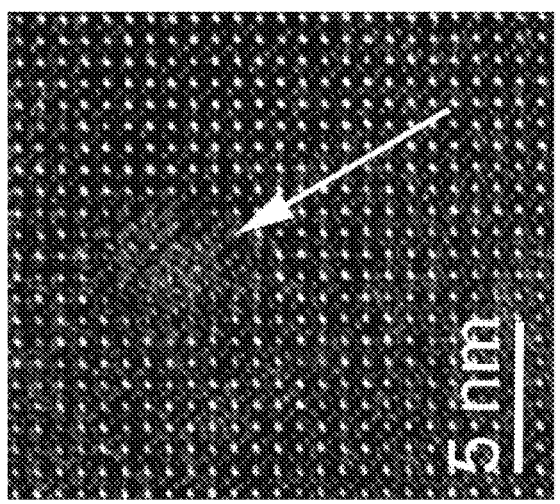
FIG. 5 is an HRTEM image of inclusion of a thermoelectric composite fabricated according to certain embodiments of the present disclosure according to embodiments of the present disclosure.

FIG. 5 is an HRTEM image of inclusion of a thermoelectric composite fabricated according to embodiments of the present disclosure. Moreover, as shown in the inset of FIG. 5, another type of inclusions with the average size around 5 nm was also observed by HRTEM. The TEM-EDS results show that this nano-inclusion has Sb at about 3 at % higher than that of the corresponding crystal grain. This HRTEM microphotograph could be regarded as a cross-section image of the nano-inclusion. Normally, the thickness of a TEM specimen might be around 10 nm to about 50 nm for HRTEM imaging, which is much bigger than the nano-inclusion (around 5 nm in diameter). The higher Sb concentration indicates the existence of Sb nanoparticles embedding in other crystal grains.

FIG. 6 illustrates a method of manufacturing the thermoelectric materials according to embodiments of the present disclosure. In method 600, a plurality of components is selected to fabricate a thermoelectric composition, these components may be vacuum melted into an ingot. In some embodiments, this method 600 may take less than three days, in alternate embodiments, less than two days, and in still other embodiments less than one day depending upon the composition used as well as equipment and materials availability. At block 602, a compound comprising a plurality of components that may be according to a formula $MT_4X_{12}$ is disposed into a ball-mill, this compound may be in the form of an ingot and, in some embodiments, may be disposed with other component. Thermo-mechanical process is a metallurgical process such as hot pressing, hot rolling, or other process that combines controlled thermal and mechanical processes to deform a material in order to obtain target material properties. The at least one compound disposed into a ball-mill, for example, a high-energy ball-mill, and may be broken up into smaller pieces from an initial ingot that may be an as-cast ingot. In an embodiment, the first component M comprises at least one of a rare earth metal, an actinide, an alkaline-earth metal, and an alkali metal, the second component T comprises at least one metal of subgroup VIII, the third component X comprises at least one pnictogen. It is appreciated that different phases of these components may be utilized in this fast-phase formation process. The at least one compound is ball-milled at block 604. In an embodiment, the ball-milling may be for a period of less than about five hours. In some embodiments, the at least one compound may be ball-milled from about two hours to about three hours, and in other embodiments, the ball-milling time may be anywhere in the range of up to about 5 hours. The size of particles after ball-milling may be below 20 nm in some embodiments, but may range up to 5 microns in alternate embodiments depending upon processing conditions, composition, and other factors. Subsequent to ball-milling at block 604, the powdered compound is thermo-mechanically processed at block 606. The powdered compound is thermo-mechanically processed, for example, by hot pressing at block 606, for less than two hours. In some embodiments, the compound may be thermo-mechanically processed for up to five hours. The hot-pressing may be at a temperature between 500° C. (773.15K) and about 800° C. (1073.15K). In some embodiments, the preferable hot-pressing temperature is 650° C. (923.15K). At block 608, subsequent to the thermo-mechanical processing, at block 606, the thermoelectric material comprises a plurality of thermoelectric properties including a Seebeck coefficient of over 150 μV/K and a dimensionless figure of merit (ZT) above 1.0 at a temperature of over 750K. In some embodiments, the pressed compound comprises an average grain size from about 200 nm to about 500 nm. It is appreciated that other desired thermo-mechanical properties as discussed herein and illustrated at least in FIGS. 3A-3F may also result from this processing. It is appreciated that the method 600 may be performed in less than three days, and in some cases as few as one day, as compared to certain conventional fabrication method which may take up to 7-14 days to complete.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as "comprises," "includes," and "having" should be understood to provide support for narrower terms such as "consisting of," "consisting essentially of," and "comprised substantially of." Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present invention.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A method of manufacturing a thermoelectric material comprising:
    thermo-mechanically processing a ball-milled compound, wherein, the compound, subsequent to the thermo-mechanical processing comprises:
        a dimensionless figure of merit (ZT) above 1.0 at above about 700K,
        a power factor above 20 $\mu WK^{-2} cm^{-1}$ above about 400K,
        a Seebeck coefficient above 120 $\mu VK^{-1}$ above about 400K, and
        a composition having the formula of $MT_4X_{12}$, wherein M comprises neodymium (Nd) and cerium (Ce).

2. The method of claim 1, further comprising thermo-mechanically processing the compound for less than two hours.

3. The method of claim 1, wherein the compound is in an as-cast state prior to ball-milling.

4. The method of claim 1, wherein M further comprises at least one of a rare earth metal, an actinide, an alkaline-earth metal, and an alkali metal.

5. The method of claim 1, wherein T comprises at least one metal of subgroup VIII.

6. The method of claim 1, wherein X comprises at least one pnictogen.

7. The method of claim 1, further comprising ball-milling the compound prior to the thermos-mechanical processing from about one hour to about five hours.

8. The method of claim 7, further comprising hot-pressing the compound at a temperature from about 600° C. to about 700° C.

9. The method of claim 1, further comprising thermo-mechanically processing the compound using hot-pressing.

10. The method of claim 1, wherein the composition comprises $Ce_xNd_xFe_{3.5}Co_{0.5}Sb_{12}$.

11. The method of claim 10, wherein x is 0.45.

12. A method of manufacturing a thermoelectric material comprising:
    thermo-mechanically processing a ball-milled compound for less than two hours, wherein the compound is formed by vacuum-melting according to a formula of $MT_4X_{12}$ and comprises an average grain size from about 200 nm to about 500 nm,
    wherein, M comprises neodymium (Nd),
    wherein, subsequent to the thermo-mechanical processing, the thermoelectric material comprises:
        a power factor above 20 $\mu WK^{-2} cm^{-1}$ above about 400K,
        a Seebeck coefficient above 120 $\mu VK^{-1}$ above about 400K, and
        a dimensionless figure of merit (ZT) above 1.0 at above about 700K.

13. The method of claim 12, wherein M further comprises at least one of a rare earth metal, an actinide, an alkaline-earth metal, and an alkali metal.

14. The method of claim 12, wherein T comprises a metal of subgroup VIII.

15. The method of claim 12, wherein X comprises a pnictogen atom.

16. The method of claim 12, further comprising thermo-mechanically processing the compound from about 600° C. to about 700° C.

17. The method of claim 12, wherein the compound, subsequent to ball-milling, comprises a plurality of particles with an average diameter less than about 1 μm.

18. The method of claim 12, wherein the compound is in an as-cast state prior to ball-milling.

\* \* \* \* \*